(12) United States Patent
Mizobuchi et al.

(10) Patent No.: US 6,507,054 B2
(45) Date of Patent: Jan. 14, 2003

(54) SOLID-STATE IMAGING DEVICE

(75) Inventors: Koichi Mizobuchi, Tsukuba (JP); Hiroyuki Gotoh, Narita (JP); Satoru Adachi, Tsuchiura (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/821,936

(22) Filed: Mar. 30, 2001

(65) Prior Publication Data

US 2002/0140003 A1 Oct. 3, 2002

(30) Foreign Application Priority Data

Mar. 31, 2000 (JP) ........................................ 2000-101326

(51) Int. Cl.[7] ............................................. H01L 27/148
(52) U.S. Cl. ........................ 257/215; 348/244; 348/207; 348/294; 257/294; 257/432; 257/435
(58) Field of Search ................................. 348/244, 207, 348/294; 257/432, 435

(56) References Cited

U.S. PATENT DOCUMENTS 5,508,740 A * 4/1996 Miyaguchi et al. .... 348/207.99

* cited by examiner

*Primary Examiner*—Hoai Ho
*Assistant Examiner*—Mai-Huong Tran
(74) *Attorney, Agent, or Firm*—William B. Kempler; W. James Brady; Frederick J. Telecky, Jr.

(57) ABSTRACT

A solid-state imaging device having contacts for a charge sweeping component or the like, with which increases in dark current can be suppressed while increases in contact resistance and the production of alloy spikes can be prevented, and a method for manufacturing this device. A solid-state imaging device has a charge accumulator for producing and accumulating signal charges when light is received, and a charge transfer component for transferring these signal charges, including a conductive layer 18 formed on a substrate 10, such as a silicon layer or metal wiring; an insulating film 21 formed over the conductive layer 18; an opening CH formed over the insulating film 21 and leading to the conductive layer 18; and a wiring layer 34 composed of aluminum containing copper in an amount between 0.4 and 5 wt %, formed at least inside the opening CH contiguously with the surface of the conductive layer 18. The wiring layer 34 is formed by coherent sputtering, and the treatment steps following the formation of the wiring layer 34 are carried out at a temperature of 350° C. or lower. Selected Figure: FIG. 3

9 Claims, 12 Drawing Sheets

SOLID-STATE IMAGING DEVICE

FIELD OF THE INVENTION

The present invention relates to a solid-state imaging device and a method for manufacturing this device, and more particularly relates to a solid-state imaging device having a charge coupled device, and to a method for manufacturing this solid-state imaging device.

BACKGROUND OF THE INVENTION

Solid-state imaging devices such as a CCD (Charge Coupled Device) generally include interline types and frame transfer types, among others.

With the above-mentioned frame transfer type, a plurality of light receiving elements called pixels are formed on a p-type silicon substrate surface, for example, dividing [the surface] into a light receiving portion and a transfer (accumulation) portion. With the pixels formed in each portion, a gate electrode is formed via a gate insulating film over a substrate, and a positive potential is applied to this gate electrode, which forms potential wells at the surface portion of the substrate, and when the pixels in the light receiving portion are irradiated with light for a specific length of time, a signal charge is generated in proportion to the amount of light, and is accumulated in the potential wells.

When clock voltage pulses of two different timings, for instance, are applied to the gate electrode of a plurality of pixels in a row, the barriers of the potential wells are successively opened and closed, and the signal charges are successively transferred from the light receiving portion to the transfer portion.

The transferred signal charges are outputted by clock [signals] having a different timing from the above-mentioned clock [signals] in a register portion, and can be outputted as video signals through an output amplifier or the like.

Thus, a CCD allows optical signals to be converted into signal charges, and are currently in use in a wide range of industrial and consumer imaging devices.

The above-mentioned CCD or other solid-state imaging device is usually equipped with an overflow drain that sweeps away excess signal charges in order to prevent overflowing signal charges from being trapped in the potential wells of other pixels when the signal charges exceed the capacity of the potential wells. Overflow drains are broadly classified into two groups: vertical overflow drains (VOD) and lateral overflow drains (LOD).

FIG. 3a is a cross section of a first conventional example of the above-mentioned lateral overflow drain.

A lateral overflow drain (LOD) is formed such that a channel separation layer (not shown) is divided at the boundary between two adjacent pixels (PC1 and PC2) separated by the channel separation layer.

In these pixel regions (PC1 and PC2), an n-type buried channel 11 that serves as a CCD transfer path is formed in a p-type semiconductor substrate 10, and a $p^+$ inversion layer 15 is formed at the surface layer thereof.

The above-mentioned n-type buried channel 11 is formed by communicating with the lateral overflow drain LOD at the boundary of the above-mentioned two pixel regions (PC1 and PC2). An $n^+$ region 18 is formed in the surface layer of the n-type buried channel 11 in the center of the lateral overflow drain LOD so as to connect with the n-type buried channel 11. A p-type region 17 into which p-type impurities have been introduced to the extent that complete inversion does not occur is formed on the surface of the n-type buried channel 11 around the annular outer periphery of the $n^+$ region 18 including the $n^+$ region 18 and the $p^+$ inversion layer 15.

A gate insulating film 20 of silicon oxide is formed over the substrate, an annular gate electrode 33 is formed over the gate insulating film 20, and a wiring layer 34 composed of aluminum, silicon-containing aluminum, or the like is formed so as to fill an opening CH in the gate insulating film 20 in the center of this annular shape, connect to the $n^+$ region 18, and also connect to the gate electrode 33.

In the above structure, the $n^+$ region 18 serves as the drain and the n-type buried channel 11 of the pixel regions (PC1 and PC2) as the source, creating a MOS field effect transistor in which the drain and gate are short-circuited and which has an annular channel formation region around the outer periphery of the $n^+$ region 18 and the gate electrode 33 over the gate insulating film 20.

FIG. 3(b) is a potential diagram in the direction parallel to the surface of the p-type semiconductor substrate 10 of the lateral overflow drain LOD with the above structure.

The p-type region 17 formed at the boundary of the $n^+$ region 18 and the n-type buried channel 11 of the pixel regions (PC1 and PC2) forms a barrier (potential barrier) to signal charges, and a well (potential well) is formed in the outer direction thereof (the direction of the pixel regions (PC1 and PC2)), in which signal charges (electrons) are accumulated.

If the signal charges exceed the capacity of the potential well, the excess signal charges go over the barrier formed by the p-type region 17 and are swept away to the $n^+$ region (drain) 18.

The method for manufacturing the above-mentioned lateral overflow drain LOD will now be described.

First, as shown in FIG. 4(a), a silicon oxide layer is formed by thermal oxidation, CVD, or another such method over the p-type semiconductor substrate 10, forming the gate insulating film 20.

Next, the n-type buried channel 11 is formed by the ion implantation of an n-type conductive impurity D1, such as phosphorus, over the entire surface.

Next, as shown in FIG. 4(b), a resist film R1 is formed by a photolithography process in a pattern that opens up the lateral overflow drain formation region, and a p-type impurity D2 such as boron is introduced by ion implantation to the extent that complete inversion does not occur, thereby forming the p-type region 17 at the surface layer of the n-type buried channel 11.

Next, as shown in FIG. 4(c), the resist film R1 is removed, after which a polysilicon film containing a conductive impurity is formed over the entire surface by CVD, for instance, a resist film (not shown) is formed in the pattern of an annular gate electrode, and etching such as RIE (Reactive Ion Etching) is performed to form the annular gate electrode 33.

Next, as shown in FIG. 5(d), a resist film R2 is formed by a photolithography process in a pattern that opens up the region that becomes the drain, an n-type impurity D3 such as arsenic is introduced by ion implantation, and the $n^+$ region 18 is formed so as to connect to the n-type buried channel 11.

The gate electrode 33 is used as a mask in the ion implantation of the above-mentioned n-type impurity D3 here, so the resist film R2 is formed in a pattern that covers roughly half of the gate electrode 33.

Next, as shown in FIG. 5(e), the resist film R2 is removed, after which a resist film R3 is formed in a pattern covering the region that becomes the drain, and the surface p$^+$ inversion layer 15 is formed by the ion implantation of a p-type impurity D4. Here, the p-type region 17 is formed in a wider pattern than the gate electrode 33, and the p-type region 17 is formed so that it protrudes from under the gate electrode 33, and as a result the p$^+$ inversion layer 15 and the p-type region 17 are connected by a somewhat overlapping portion.

Next, as shown in FIG. 6(f), the resist film R3 is removed and silicon oxide is deposited over the entire surface covering the gate electrode 33 by CVD, for instance, forming an interlayer insulating film 21.

Next, a resist film R4 is formed by a photolithography process in a pattern that opens up the region that becomes the drain, just as with the resist film R2.

Next, as shown in FIG. 6(g), the interlayer insulating film 21 and the gate insulating film 20 are etched by RIE or other etching using the resist film R4 as a mask so as to have a selectivity ratio with respect to the gate electrode 33, forming the opening CH that exposes the n$^+$ region 18. After this the resist film R4 is removed.

Next, [pure] aluminum or aluminum containing about 1% silicon is deposited over the entire surface by sputtering using DC magnetron discharge or another such method so as to connect to the n$^+$ region 18 and the gate electrode 33, which fills in the opening CH. After this, the wiring layer 34 is formed through photolithography and dry etching, for example, which results in the structure shown in FIG. 3(a).

With the above CCD, a reduction in pixel size is accompanied by a reduction in the gate design dimensions (design rule). For example, with state-of-the-art devices, the minimum gate design dimensions are about to go from half-micron to sub-micron, and in wiring such as the wiring layer wiring such as the wiring layer 34 connected to the n$^+$ region 18, the contact diameter or pier hole diameter is being reduced to the half-micron (0.5 $\mu$m) level.

However, the above-mentioned pixel size, contact diameter, and so forth continue to be reduced, and when, as shown in FIG. 17, the contact diameter ($\varnothing_{CH}$) is reduced to 0.8 $\mu$m or less and the contact hole aspect ratio (contact hole depth DP: contact diameter $\varnothing_{CH}$) rises above 1:1, then if, for example, the above-mentioned wiring layer is formed from a conductive material such as [pure] aluminum or aluminum containing about 1% silicon, the film thus formed will have greater overhang and step coverage will not be as good, which tends to lead to contact coverage flaws F where the barrier portion near the contact bottom is not covered by the conductive material.

When the above-mentioned wiring layer is formed from aluminum, the aluminum will be in contact with the silicon substrate, so aluminum alloy spikes S tend to be produced when the aluminum draws up the silicon in the substrate, or when the aluminum diffuses into substrate, for example, during the various treatment steps including sintering (such as 30 minutes at 450° C.) carried out for any of a variety of purposes, such as removal at the interfacial level by hydrogen treatment, transistor threshold adjustment, or promotion of aluminum crystallization, and these spikes result in severe leak current at shallow p-n or n-p junctions.

One way to avoid the formation of these alloy spikes is to add about 1% silicon to the aluminum that will become the wiring layer in contact with the substrate, thereby preventing the silicon from being drawn up from the substrate and stopping the formation of the alloy spikes S, but in this case, as shown in FIG. 19, the silicon concentration of the contact bottom portion R rises (the silicon precipitates) in the treatment steps following the formation of the wiring layer, so even when a relatively large contact hole diameter of about 1.4 $\mu$m is used, there tends to be a problem in that the contact resistance is too high (about 3000 $\Omega$).

One method that is known and widely used with DRAM (Dynamic Random Access Memory), logic devices, and so forth in order to avoid the above problems such as alloy spikes and increased contact resistance involves forming a barrier metal film comprising a titanium (Ti)/titanium nitride (TiN) deposited film by collimation sputtering or other such method, then performing a suitable annealing treatment, and finally forming a tungsten (W) film by CVD.

FIG. 20(a) is a cross section of a lateral overflow drain when the above method is employed for the contact connection of a lateral overflow drain. A barrier metal film 34a comprising a Ti/TiN deposited film is formed, after which a suitable annealing treatment is performed, and a W film 34b is then formed by deposition.

Nevertheless, although the above problems of alloy spike production, increased contact resistance, and so forth can indeed be solved when the above structure in which the barrier metal film 34a (a Ti/TiN deposited film) and the W film 34b are deposited is used in a CCD application, a new problem occurs in that there is a dramatic increase in dark current, which is a critical problem for an imaging device.

FIG. 20(b) is a graph produced by measuring the dark current (relative value) when the wiring for contact connection in a CCD (7.2 $\mu$m pixels) with a virtual gate structure having a 1.4 $\mu$m contact diameter is formed from (A) aluminum containing about 1% silicon, (B) a Ti (thickness: 50 nm)/TiN/W deposited film, and (C) Ti (thickness: 100 nm)/TiN/W deposited film was used, and then plotting this against cumulative probability.

It was confirmed from FIG. 20(b) that dark current is markedly increased by the use of a Ti/TiN/W deposited film, and is further increased when the Ti film is made thicker.

An aluminum reflow method, a high-pressure aluminum fill method, a CVD aluminum method, and the like have been disclosed in an effort to form the above-mentioned contact wiring for a DRAM, logic device, and so forth, but all of these require the above-mentioned Ti-based barrier metal, leading to the problem of worsening dark current.

The present invention was conceived in light of the above problems, and it is an object thereof to provide a solid-state imaging device having contact connection in an overflow drain or the like, with which increases in dark current can be suppressed while increases in contact resistance and the production of alloy spikes can be prevented, and also to provide a method for manufacturing a solid-state imaging device, with which the above-mentioned solid-state imaging device can be formed.

SUMMARY OF THE INVENTION

In order to achieve the stated object, the solid-state imaging device of the present invention comprises a semiconductor substrate of a first conduction type, a semiconductor layer of a second conduction type formed on the main surface of the semiconductor substrate, a separation region of a first conduction type formed on the main surface of the semiconductor substrate so as to demarcate the semiconductor layer, an annular first semiconductor region of a first conduction type formed adjacent to the separation region within the semiconductor layer demarcated by the separation region on the main surface of the semiconductor substrate, a second semiconductor region of a second conduction type formed touching the first semiconductor region on the inside of the first semiconductor region on the main surface of the semiconductor substrate, a first insulating film formed annularly over the first semiconductor region, and an electrode formed over the first insulating film so as to be contiguous with the second semiconductor region via an opening formed in the first insulating film, wherein the electrode is made up of aluminum containing copper, and a charge sweeping component is constituted by the first semiconductor region, the second semiconductor region, the first insulating film, and the electrode.

Preferably, the copper is contained in the solid-state imaging device of the present invention in an amount of 0.4 to 5 wt %, and even more preferably 0.5 to 0.8 wt %.

The solid-state imaging device of the present invention makes use of copper-containing aluminum as the material of the electrode directly connected to the silicon layer or other conductive layer and the contacts and so forth in a lateral overflow drain (LOD). By using aluminum containing copper for the material of the electrode, increases in dark current in the solid-state in dark current in the solid-state imaging device can be suppressed while increases in contact resistance and the production of alloy spikes can be prevented.

If the copper is contained in the aluminum in an amount less than 0.4 wt %, it will not be sufficient to prevent the production of alloy spikes, so greater restrictions will be imposed on the manufacturing process temperature in order to prevent these alloy spikes, making manufacture more difficult. On the other hand, if the copper content is over 5 wt %, the material will not lend itself to etching and other types of working, again making manufacture more difficult. The best range for the above-mentioned copper content is 0.5 to 0.8 wt %, within which the effects of the present invention can be easily realized without sacrificing workability and so on.

Also, in order to achieve the stated object, the method of the present invention for manufacturing a solid-state imaging device comprises the steps of forming a semiconductor layer of a second conduction type on the main surface of a semiconductor substrate of a first conduction type, forming a separation region of a first conduction type for demarcating the semiconductor layer on the main surface of the semiconductor substrate, forming a first insulating layer over the semiconductor layer, forming a first opening by etching the first insulating layer, through which the semiconductor layer demarcated by the separation region is exposed within the semiconductor layer, forming a first semiconductor region of a first conduction type by the implantation of impurities of a first conduction type using the first insulating layer as a mask, forming a second insulating layer over the first insulating layer including the first opening, etching the entire surface of the second insulating layer and thereby forming an annular first insulating film around the periphery of the first opening, and forming a second opening through which the semiconductor layer is exposed on the inside of the first insulating film, forming a second semiconductor region of a second conduction type on the inside of the first semiconductor region by the implantation of impurities of a second conduction type using the first insulating film as a mask, and forming over the first insulating film an electrode that is connected to the second semiconductor region via the second opening, wherein the electrode is made up of aluminum containing copper.

The above-mentioned electrode is preferably formed by coherent sputtering in the method of the present invention for manufacturing a solid-state imaging device.

Also, a sintering treatment is preferably carried out at a temperature of 350° C. or lower after the step of forming the electrode in the method of the present invention for manufacturing a solid-state imaging device.

Also, the copper content is preferably 0.4 to 5 wt %, and even more preferably 0.5 to 0.8 wt %, in the method of the present invention for manufacturing a solid-state imaging device.

The method of the present invention for manufacturing a solid-state imaging device involves the use of copper-containing aluminum for the material of the electrode, which suppresses increases in dark current in the solid-state imaging device while preventing increases in contact resistance and the production of alloy spikes in the manufacture of the solid-state imaging device. Furthermore, the electrode composed of copper-containing aluminum is formed by coherent sputtering, which prevents contact coverage flaws from occurring. The sintering treatment carried out after the electrode formation is conducted at a temperature of 350° C. or lower, effectively preventing the production of alloy spikes.

If the copper content in the aluminum is less than 0.4 wt %, it will not be sufficient to prevent the production of alloy spikes, so greater restrictions will be imposed on the manufacturing process temperature in order to prevent these alloy spikes, making manufacture more difficult. On the other hand, if the copper content is over 5 wt %, the material will not lend itself to etching and other types of working, again making manufacture more difficult. The best range for the above-mentioned copper content is 0.5 to 0.8 wt %, within which the effects of the present invention can be easily realized without sacrificing workability and so on.

REFERENCE NUMERALS AND SYMBOLS AS SHOWN IN THE FIGURES

10 . . . p-type semiconductor substrate, 11 . . . n-type buried channel, 12 . . . p⁺ channel separation layer, 13 . . . first n⁺ region, 14 . . . second n⁺ region, 15 . . . (first) p⁺ inversion layer, 16 . . . second p⁺ inversion layer, 17 . . . p-type region, 18 and 19 . . . n⁺ regions, 20 . . . gate insulating film, 21 . . . interlayer insulating film, 21' . . . upper insulating film, 22 and 22a . . . screen oxide films, 23 . . . sidewall insulating film layer, 23a . . . sidewall insulating film, 30 . . . gate electrode, 33 . . . (LOD-use) gate electrode, 34 . . . wiring layer, 34a . . . barrier metal layer, 34b . . . . tungsten layer, CH, CH1, and CH2 . . . openings, D1 to D8 . . . conductive impurities, R1 to R5 . . . resist films, CS . . . channel separation layer, G . . . gate electrode, LOD . . . lateral overflow drain, CT . . . charge transfer direction, PC1 and PC2 . . . pixels, PP . . . polyphase, VP . . . virtual gate phase.

DESCRIPTION OF THE EMBODIMENTS

Embodiments of the present invention will now be described through reference to the drawings.

First Embodiment

Figure 1:
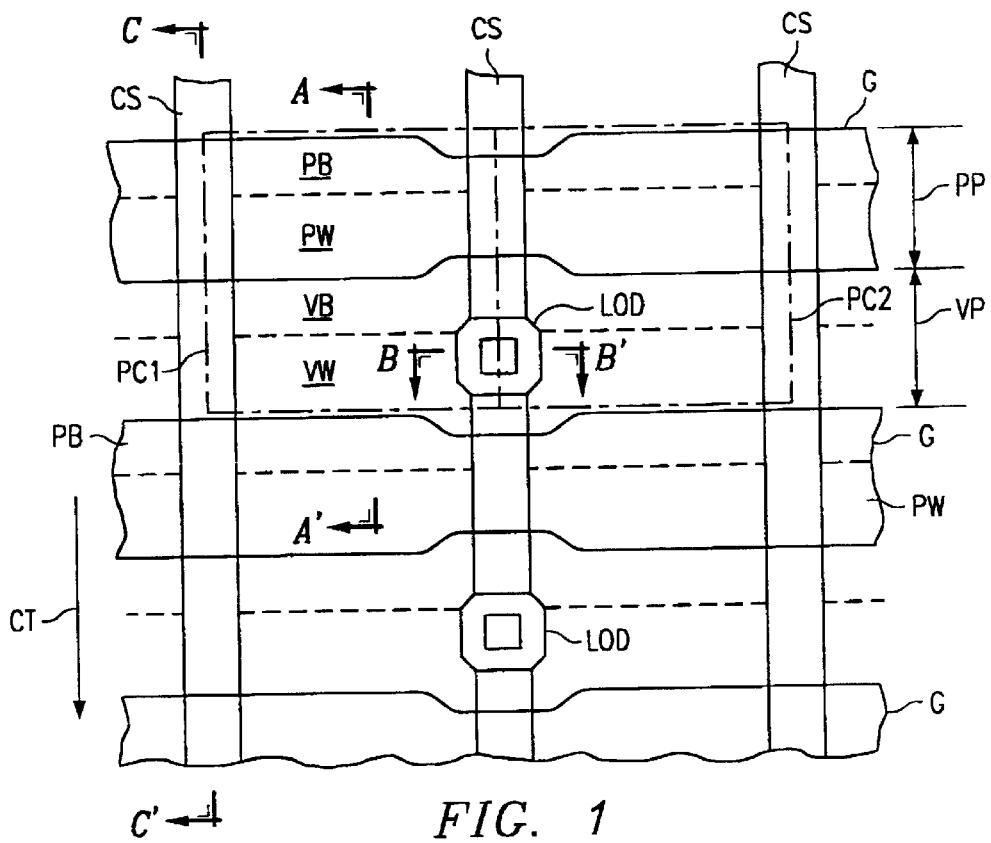
FIG. 1 is a plan view of a CCD pertaining to the present invention.

FIG. 1 is a plan view of a solid-state imaging device (CCD) pertaining to the present invention. This is a buried channel, single-phase drive type CCD having a virtual gate structure.

An n-type buried channel that is composed of a silicon layer containing an n-type conductive impurity and that transfers signal charges in the direction of the arrow CT is formed in the region of a p-type silicon semiconductor substrate separated by a p-type channel separation layer CS.

A gate electrode G composed of polysilicon, for example, is formed over the n-type buried channel via a gate insulating film composed of silicon oxide, for example, in the direction perpendicular to the direction in which the n-type buried channel is formed.

A PB component that serves as a barrier and a PW component that serves as a well are formed in that order in the direction of the arrow CT in the lower region of the gate electrode G, while a VB component that serves as a barrier and a VW component that serves as a well are formed in that order in the direction of the arrow CT in the space between two gate electrodes G. The PB, PW, VB, and VW components constitute a single pixel. The PB and PW components together are called a polyphase (a phase of a gate composed of polysilicon) PP, while the VB and VW components together are called a virtual gate phase VP.

A lateral overflow drain LOD that sweeps away excess signal charges in order to prevent overflowing signal charges from being trapped in the potential wells of other pixels when the signal charges exceed the capacity of a potential well such as the PW component or the VW component is provided at a location dividing the channel separation layer CS, which serve as a boundary between two adjacent pixels (PC1 and PC2).

Figure 2A:
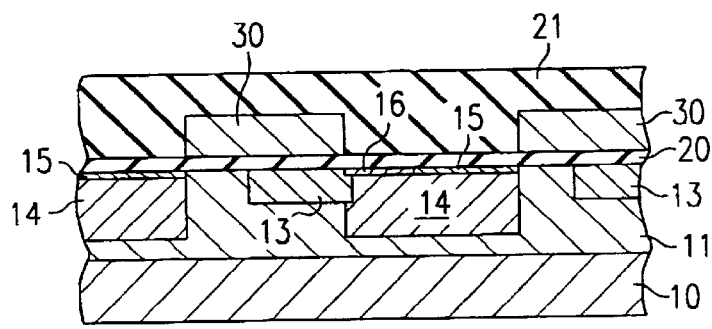
FIG. 2(a) is a cross section along the A–A' line in FIG. 1.

FIG. 2(a) is a cross section along the A–A' line in FIG. 1.

An n-type buried channel 11 composed of a silicon layer containing an n-type conductive impurity is formed in the region of a p-type silicon semiconductor substrate 10 separated by a p-type channel separation layer (not shown). A gate insulating film 20 of silicon oxide, for example, is formed over this, and a gate electrode 30 composed of polysilicon, for example, is formed over this. A first n⁺ region 13, which is a region of high concentration of an n-type conductive impurity, is formed in the channel formation region 11 under the gate electrode 30, and this region becomes the PW component. All of the region under the gate electrode 30 other than the PW component becomes the PB component.

In the space between gate electrodes 30, a first p⁺ inversion layer 15 containing a p-type conductive impurity and a second p⁺ inversion layer 16 containing a higher concentration of the p-type conductive impurity than the first p⁺ inversion layer 15 are formed in the n-type buried channel 11, and a second n⁺ region 14, which is a region of high concentration of an n-type conductive impurity, is formed in the n-type buried channel 11 under the first p⁺ inversion layer 15 and the second p⁺ inversion layer 16, resulting in a virtual gate region. The region under the first p⁺ inversion layer 15 becomes the VW component, while the region under the second p⁺ inversion layer 16 becomes the VB component.

As discussed above, a single CCD cell (pixel) is made up of a single gate electrode 30 and a single virtual gate, that is the four phases of the PB, PW, VB, and VW components, and these four phases are repeatedly formed in the direction in which the signal charges are transferred.

An interlayer insulating film 21 is formed over the gate electrodes 30, so that the gate electrodes 30 are covered.

Figure 2B:
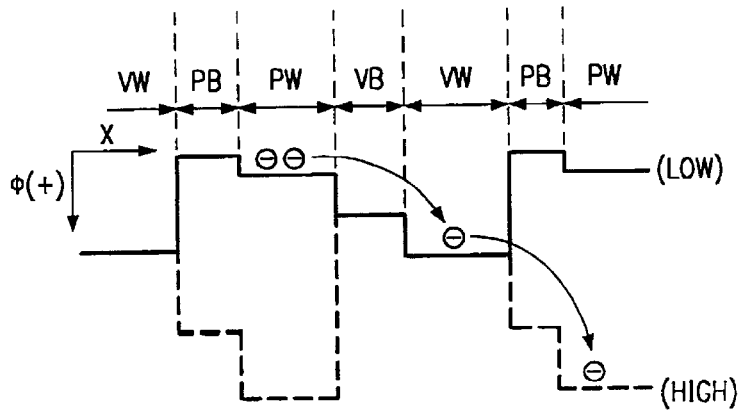
FIG. 2(b) is a potential graph illustrating CCD transfer.

FIG. 2(b) is a potential graph of the above-mentioned CCD cell (pixel), and illustrates how the signal charges are transferred and the potential of the four phases of the PB, PW, VB, and VW components.

Common voltage pulses (high and low) are applied to the gate electrode 30 of each cell, while in the virtual gate region the gate electrode has no effect due to the first $p^+$ inversion layer 15 and the second $p^+$ inversion layer 16, affording a constant potential. In other words, the virtual gate region operates the same as an electrode of a specific voltage even if there is no electrode.

When the gate electrodes 30 change from high to low, the signal charges are transferred from the PW component to the VW component, and when the change is from low to high, they are transferred from the VW component to the PW component. Here, the PB and VB components act as barriers for preventing the backflow of the signal charges in order for the transfer operation to be smoother, and the PW and VW components act as wells for accumulating the signal charges.

Figure 3A:
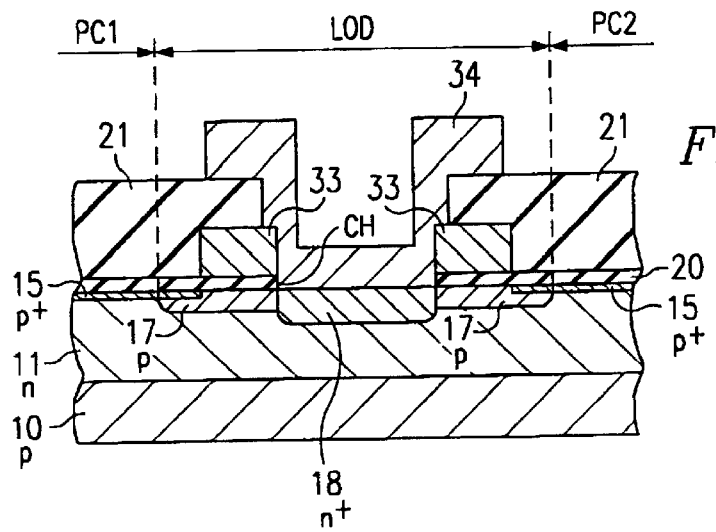
FIG. 3(a) is a cross section of the overflow drain portion of CCD's pertaining to the first embodiment of the present invention and to a conventional example.

FIG. 3(a) is a cross section along the B–B' line in FIG. 1.

The lateral overflow drain LOD is formed such that the above-mentioned channel separation layer (not shown) is divided at the boundary between two pixel regions (PC1 and PC2) that are divided by a channel separation layer.

In the above-mentioned pixel regions (PC1 and PC2), the n-type buried channel 11, which serves as a CCD transfer path, is formed in the p-type semiconductor substrate 10, and the first $p^+$ inversion layer 15 is formed on the surface thereof.

Meanwhile, the above-mentioned n-type buried channel 11 is also formed by communicating with the lateral overflow drain region LOD at the boundary between the two pixel regions (PC1 and PC2). The $n^+$ region 18 is formed on the surface of the n-type buried channel 11 in the center of the lateral overflow drain region LOD so as to connected with the n-type buried channel 11. The p-type region 17 into which p-type impurities have been introduced to the extent that complete inversion does not occur is formed on the surface of the n-type buried channel 11 around the annular outer periphery of the $n^+$ region 18 including the $n^+$ region 18 and the $p^+$ inversion layer 15.

The gate insulating film 20 of silicon oxide is formed over the substrate, an annular gate electrode 33 is formed over the gate insulating film 20, and a wiring layer 34 composed of aluminum is formed so as to fill the opening CH in the gate insulating film 20 in the center of this annular shape, connect to the $n^+$ region 18, and also connect to the gate electrode 33. This wiring layer 34 is formed as wiring that does not cross the pixel region over the channel separation layer.

In the above structure, the $n^+$ region 18 serves as the drain and the n-type buried channel 11 of the pixel regions (PC1 and PC2) as the source, creating a MOS field effect transistor in which the drain and gate are short-circuited and which has an annular channel formation region around the outer periphery of the $n^+$ region 18 and the gate electrode 32 [sic; 33] over the gate insulating film 20.

Figure 3B:
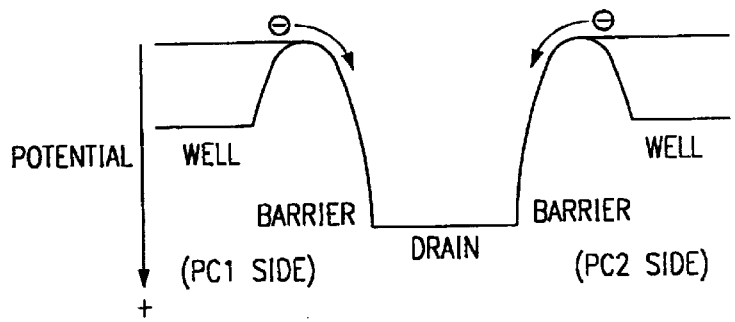
FIG. 3(b) is a potential graph for this cross section, corresponding to a cross section along the B–B' line in FIG. 1.

FIG. 3(b) is a potential diagram in the direction parallel to the surface of the p-type semiconductor substrate 10 of the lateral overflow drain LOD with the above structure.

The p-type region 17 formed at the boundary of the $n^+$ region 18 and the n-type buried channel 11 of the pixel regions (PC1 and PC2) forms a barrier (potential barrier) to signal charges, and a well (potential well) is formed in the outer direction thereof (the direction of the pixel regions (PC1 and PC2)), in which signal charges (electrons) are accumulated.

If the signal charges exceed the capacity of the potential well, the excess signal charges go over the barrier formed by the p-type region 17 and are swept away to the $n^+$ region (drain) 18.

Furthermore, by controlling the voltage applied to the wiring layer 34, the potential barrier formed by the p-type region 17 is lessened or eliminated, allowing all of the accumulated charges to be swept away. Once all the signal charges have thus been removed, the signal charges are controlled so that they will be accumulated once again at a specific timing, which imparts an electronic shutter function to the CCD in this embodiment.

In the CCD in the above embodiment, aluminum containing copper is used as the wiring material that is in direct contact with the silicon substrate (the $n^+$ region 18) in the contact to the $n^+$ region 18 of the silicon substrate surface layer in the lateral overflow drain (LOD).

As a result, increases in dark current can be suppressed while preventing increases in contact resistance and the production of alloy spikes.

If the copper is contained in the aluminum in an amount less than 0.4 wt %, it will not be sufficient to prevent the production of alloy spikes, so greater restrictions will be imposed on the manufacturing process temperature in order to prevent these alloy spikes, making manufacture more difficult. On the other hand, if the copper content is over 5 wt %, the material will not lend itself to etching and other types of working, again making manufacture more difficult. The best range is 0.5 to 0.8 wt %, within which the effects of the present invention can be easily realized without sacrificing workability and so on.

The method for manufacturing a CCD having the above-mentioned lateral overflow drain LOD will now be described.

Figure 4A:
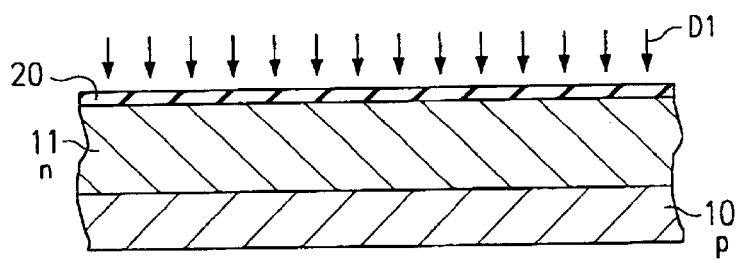
FIG. 4 consists of cross sections of the manufacturing steps in the method for manufacturing a CCD having an overflow drain shown in FIG. 3, with FIG. 4(a) illustrating the step of forming an n-type buried channel, FIG. 4(b) the step of forming a p-type region, and FIG. 4(c) the step of patterning the gate electrode.

First, as shown in FIG. 4(a), a silicon oxide layer is formed by thermal oxidation, CVD (Chemical Vapor Deposition), or another such method over the p-type silicon semiconductor substrate 10, forming the gate insulating film 20 that serves as the gate insulating film.

Next, the n-type buried channel 11 is formed by the ion implantation of an n-type conductive impurity D1, such as phosphorus, over the entire surface.

Figure 4B:
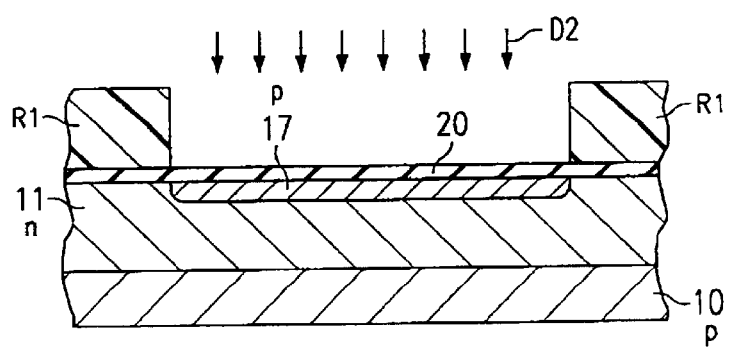

Next, as shown in FIG. 4(b), a resist film R1 is formed by a photolithography process in a pattern that opens up the lateral overflow drain formation region, and a p-type impurity D2 such as boron is introduced by ion implantation to the extent that complete inversion does not occur, thereby forming the p-type region 17 at the surface layer of the n-type buried channel 11.

Figure 4C:
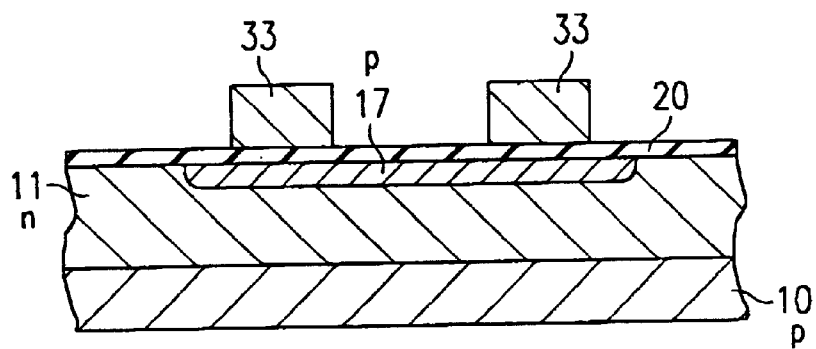

Next, as shown in FIG. 4(c), the resist film R1 is removed, after which a polysilicon film containing a conductive impurity is formed over the entire surface by CVD, for instance, a resist film (not shown) is formed in the pattern of an annular gate electrode, and etching such as RIE (Reactive Ion Etching) is performed to form the annular gate electrode 33.

Figure 5D:
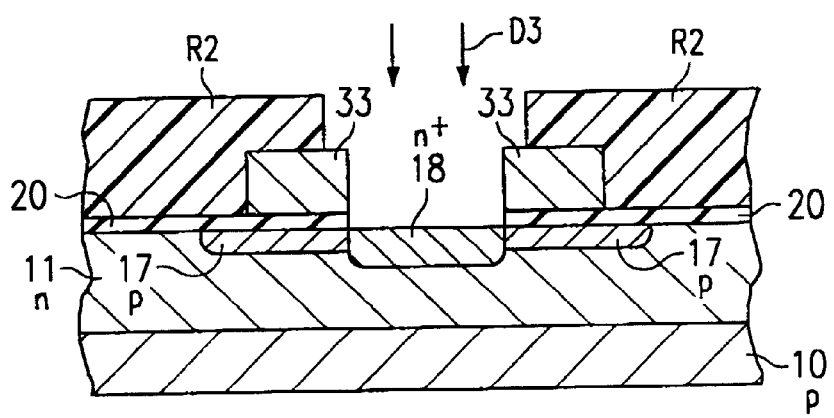
FIG. 5 is a continuation of the steps from FIG. 4, with FIG. 5(d) illustrating the step of forming an n$^+$ region and FIG. 5(e) the step of forming a p$^+$ inversion layer.

Next, as shown in FIG. 5(d), a resist film R2 is formed by a photolithography process in a pattern that opens up the region that becomes the drain, an n-type impurity D3 such as arsenic is introduced by ion implantation, and the $n^+$ region 18 is formed so as to connect to the n-type buried channel 11.

The gate electrode 33 is used as a mask in the ion implantation of the above-mentioned n-type impurity D3 here, so the resist film R2 is formed in a pattern that covers roughly half of the gate electrode 33.

Figure 5E:
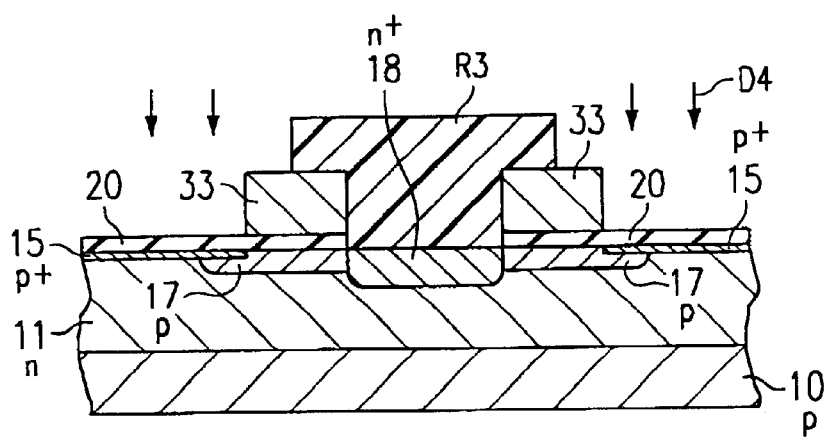

Next, as shown in FIG. 5(e), the resist film R2 is removed, after which a resist film R3 is formed in a pattern covering the region that becomes the drain, and the surface $p^+$ inversion layer 15 is formed by the ion implantation of a p-type impurity D4. Here, the p-type region 17 is formed in a wider pattern than the gate electrode 33, and the p-type region 17 is formed so that it protrudes from under the gate electrode 33, and as a result the $p^+$ inversion layer 15 and the p-type region 17 are connected by a somewhat overlapping portion.

Figure 6F:
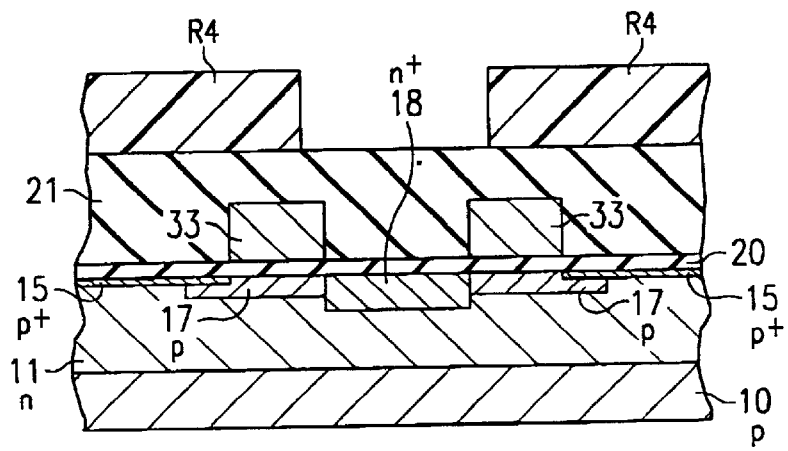
FIG. 6 is a continuation of the steps from FIG. 5, with FIG. 6(f) illustrating the step of forming an interlayer insulating film and FIG. 6(g) the step for making an opening leading to the n$^+$ region.

Next, as shown in FIG. 6(f), the resist film R3 is removed, after which silicon oxide is deposited over the entire surface covering the gate electrode 33 by CVD, for instance, forming an interlayer insulating film 21.

Next, a resist film R4 is formed by a photolithography process in a pattern that opens up the region that becomes the drain, just as with the resist film R2.

Figure 6G:
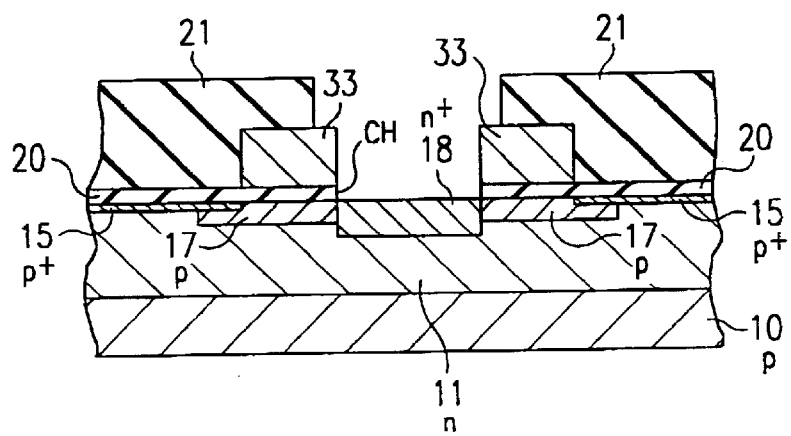

Next, as shown in FIG. 6(g), the interlayer insulating film 21 and the gate insulating film 20 are etched by RIE or other etching using the resist film R4 as a mask so as to have a selectivity ratio with respect to the gate electrode 33, forming the opening CH that exposes the $n^+$ region 18. After this the resist film R4 is removed.

Next, aluminum containing copper is deposited over the entire surface by long-distance sputtering, collimator sputtering, IMP sputtering, or another such coherent sputtering method so as to connect to the $n^+$ region 18 and the gate electrode 33, which fills in the opening CH. After this, the wiring layer 34 is formed through photolithography and dry etching, for example, which results in the structure shown in FIG. 3(a).

Long-distance sputtering refers to a sputtering method in which the distance between the target and the substrate being treated, which is set to about 10 cm in an ordinary sputtering method using DC magnetron discharge, is instead set to about 20 to 25 cm. This allows the ions to be perpendicularly incident on the substrate being treated.

Collimator sputtering refers to a method in which the ions are emitted perpendicular to the substrate being treated by removing with a mask any ions that are moving horizontally with respect to the substrate so that only the perpendicular component passes through.

IMP is a method in which voltage is applied to the ions to accelerate them so that they are perpendicularly incident on the substrate being treated.

The various coherent sputtering methods discussed above allow a film to be formed with better coverage, and prevent the occurrence of coverage flaws even if the aspect ratio is high in contact holes and so on.

All subsequent steps, including sintering, are carried out at a temperature of 350° C. or lower. Also, the total duration of the treatment during which the temperature is 350° C. is set to no more than 2 hours.

For instance, a silicon oxide film is deposited over the entire surface for 5 minutes at 350° C. by plasma CVD using TEOS (tetraethylorthosilicate) as the raw material, the coating/curing of an SOG film is conducted for 60 minutes at 350° C., and following the etch-back of the SOG film, a silicon oxide film is again deposited over the entire surface for 5 minutes at 350° C. by plasma CVD using TEOS.

Next, a resist film in a pier pattern is formed by a photolithography process, and pier holes are opened by RIE or other etching.

Next, just as above, aluminum containing copper is deposited over the entire surface by coherent sputtering, which fills in the pier holes, and the upper layer wiring is formed through photolithography and dry etching, for example.

Next, silicon oxide is deposited over the entire surface for 5 minutes at 350° C. by plasma CVD using TEOS to form a passivation film, and sintering is performed for 30 minutes at 350° C. The pad portions can also be opened to create the desired CCD.

The above method for manufacturing a CCD in this embodiment involves the use of copper-containing aluminum for the wiring material of the contacts of a lateral overflow drain LOD, and a solid-state imaging device can therefore be manufactured in which increases in dark current are suppressed while increases in contact resistance and the production of alloy spikes are prevented.

Also, the occurrence of contact coverage flaws can be prevented by forming a wiring layer composed of aluminum containing copper by coherent sputtering. In addition, the production of alloy spikes can be effectively prevented by performing all of the treatment steps, including sintering, subsequent to the wiring layer formation for connecting to the contacts at a temperature no higher than 350° C.

Second Embodiment

Figure 7:
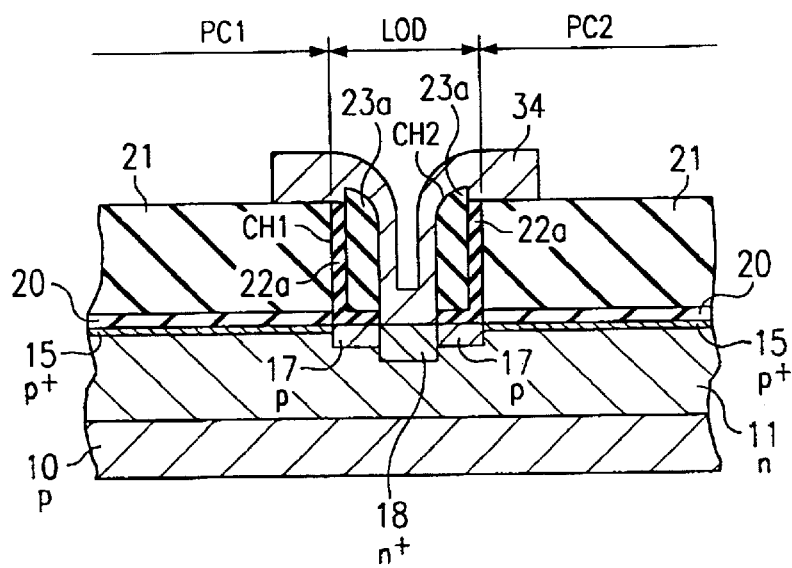
FIG. 7 is a cross section of the overflow drain portion of the CCD pertaining to the second embodiment of the present invention.

The lateral overflow drain LOD of the CCD pertaining to this embodiment has the cross sectional structure shown in FIG. 7.

A lateral overflow drain LOD is formed such that a $p^+$ channel separation layer (not shown) is divided at the boundary between two adjacent pixels (PC1 and PC2) separated by the $p^+$ channel separation layer.

In the above-mentioned pixel regions (PC1 and PC2), an n-type buried channel 11 that serves as a CCD transfer path is formed in a p-type semiconductor substrate 10, and a $p^+$ inversion layer 15 is formed at the surface layer thereof.

The above-mentioned n-type buried channel 11 is also formed communicating with the lateral overflow drain LOD at the boundary of the two pixel regions (PC1 and PC2). Meanwhile, the interlayer insulating film 21 and the gate insulating film 20 are formed by deposition over the semiconductor substrate on which the n-type buried channel 11 has been formed as above, and in the lateral overflow drain LOD, a first opening CH1 is formed in the gate insulating film 20 and the interlayer insulating film 21 so as to expose the semiconductor substrate.

In the first opening CH1, a sidewall insulating film 23a composed of a polysilicon or other insulating film containing no conductive impurity, or silicon nitride, is formed over the semiconductor substrate 10 covering the inner walls via a screen oxide film 22a, creating a second opening CH2 with a smaller opening diameter than the first opening CH1. Specifically, the diameter of the second opening CH2 is narrower than the diameter of the first opening CH1 by the width of the screen oxide film 22a and the sidewall insulating film 23a.

A p-type region 17 into which p-type impurities have been introduced to the extent that complete inversion does not occur is formed at the surface layer of the n-type buried channel 11 in the annular region under the sidewall insulating film 23a, and an $n^+$ region 18 containing a high concentration of n-type impurities is formed at the surface layer of the n-type buried channel 11 in the second opening CH2.

A wiring layer 34 composed of aluminum containing copper is formed so as to fill in the second opening CH2 and connect to the n+ region 18. The amount of copper contained in the aluminum is the same as in the first embodiment. This wiring layer 34 is formed as wiring that does not cross the pixel region over the channel separation layer.

With a CCD having a lateral overflow drain LOD of the above structure, increases in dark current can be suppressed while preventing increases in contact resistance and the production of alloy spikes.

Also, a lateral overflow drain LOD with the above structure can be used for further reduction in size, minimizing variance in barrier height when [a barrier] is shared by two pixels.

The method for manufacturing a CCD having the above-mentioned lateral overflow drain LOD will now be described.

Figure 8A:
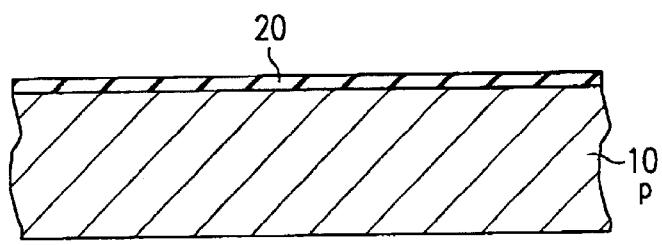
FIG. 8 consists of cross sections of the manufacturing steps in the method for manufacturing a CCD having an overflow drain shown in FIG. 7, with FIG. 8(a) illustrating the step of forming a gate insulating film, FIG. 8(b) the step of forming a first p$^+$ inversion layer and an n-type buried channel, and FIG. 8(c) the step of forming a first opening to the interlayer insulating film.

First, as shown in FIG. 8(a), a silicon oxide layer is formed by thermal oxidation, CVD, or another such method over the p-type semiconductor substrate 10, forming the gate insulating film 20.

Figure 8B:
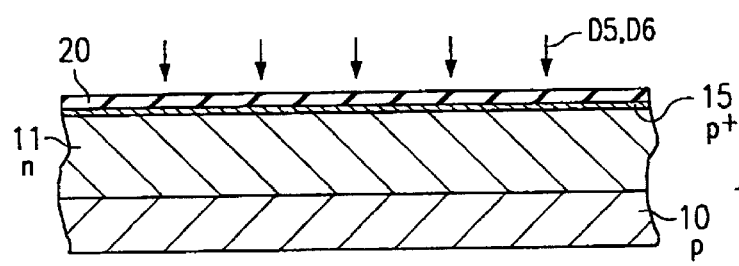

Next, as shown in FIG. 8(b), an n-type conductive impurity D5 such as phosphorus and a p-type conductive impurity D6 such as boron are introduced by ion implantation, thereby forming the n-type buried channel 11 and the first p+ inversion layer 15.

Although not shown, the above-mentioned conductive impurity D5 forms an n-type buried channel by being similarly introduced over the entire surface in the adjacent pixel regions as well, while the conductive impurity D6 is introduced only in the virtual gate region.

Figure 8C:
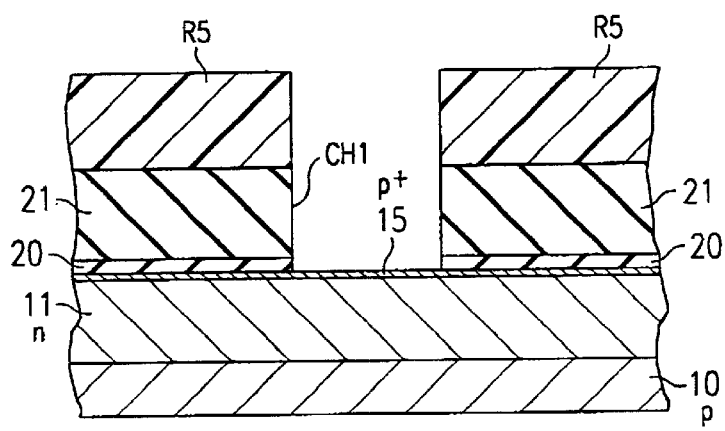

Next, as shown in FIG. 8(c), the interlayer insulating film 21 is formed by depositing silicon oxide over the entire surface by reduced pressure CVD using TEOS as the raw material, for example.

Next, a resist film R5 is formed by a photolithography process in a pattern that opens up the lateral overflow drain formation region, and the first opening CH1, which exposes the semiconductor substrate in the region when the lateral overflow drain is formed, is formed by RIE or other etching. The diameter of the first opening CH1 is about 0.5 to 2.0 μm, for example.

Figure 9D:
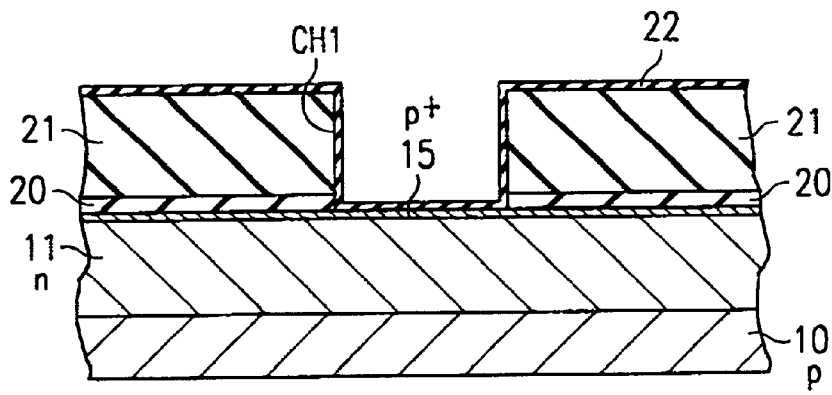
FIG. 9 is a continuation of the steps from FIG. 8, with FIG. 9(d) illustrating the step of forming a screen oxide film, FIG. 9(e) the step of forming a p-type region, and FIG. 9(f) the step of forming a sidewall insulation film layer.

Next, as shown in FIG. 9(d), the inner walls of the first opening CH1 are covered, and silicon oxide is deposited over the entire surface in a thickness of 10 nm, for instance, by reduced pressure CVD or another CVD process using TEOS or the like as the raw material, thereby forming the screen oxide film 22(a).

Figure 9E:
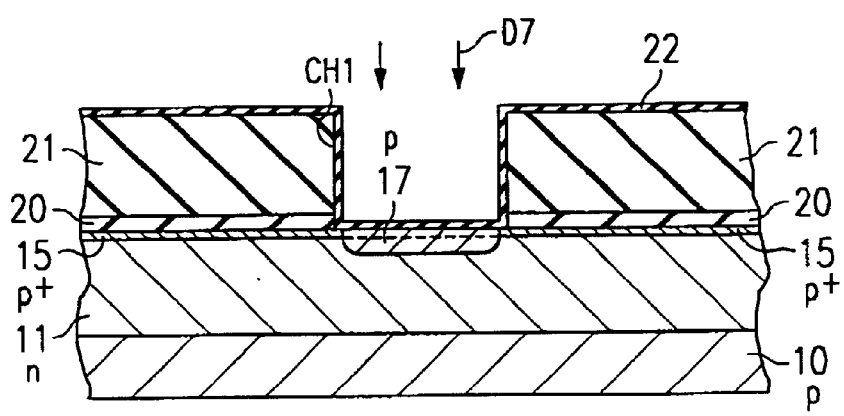

Next, as shown in FIG. 9(e), a p-type impurity D7 such as boron is introduced through the screen oxide film 22 by ion implantation to the extent that complete inversion does not occur, using the interlayer insulating film 21 as a mask, thereby forming the p-type region 17 at the surface layer of the n-type buried channel 11 inside the first opening CH1.

Here, since the first p+ inversion layer 15 has already been formed in the region where the p-type region 17 is formed, the p-type region 17 and the first p+ inversion layer 15 are formed so as to be connected.

Figure 9F:
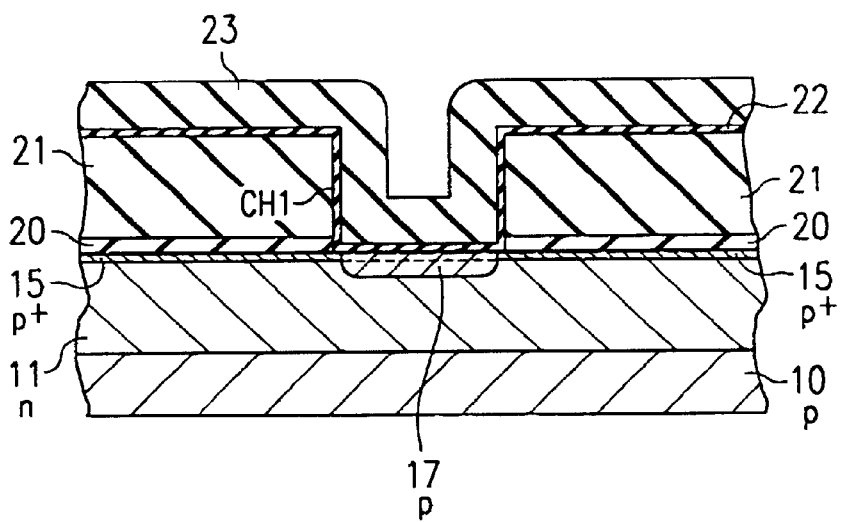

Next, as shown in FIG. 9(f), an insulator such as poly-silicon containing no conductive impurity, or silicon nitride, is formed by CVD, for example, over the entire surface on top of the screen oxide film 22, including the inside of the first opening CH1, thereby forming the sidewall insulating film layer 23.

Figure 10G:
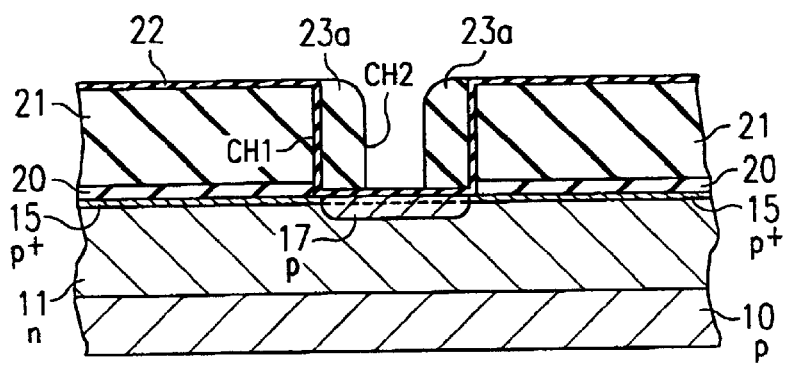
FIG. 10 is a continuation of the steps from FIG. 9, with FIG. 10(g) illustrating the step of forming a sidewall insulation film, FIG. 10(h) the step of forming an n⁺ region, and FIG. 10(i) the step of removing the screen oxide film at the bottom of a second opening.

Next, as shown in FIG. 10(g), etch-back is performed by RIE or other etching having an etching selectivity ratio with respect to the screen oxide film 22, which leaves behind the portion covering the inner walls of the first opening CH1 and removes the sidewall insulating film layer 23 in the shape of the sidewall insulating film 23a. When the thickness of the sidewall insulating film layer 23 is 0.2 to 0.4 μm, for example, the width of the sidewall insulating film 23a can also be 0.2 to 0.4 μm. Forming the sidewall insulating film 23a inside the first opening CH1 as above narrows the diameter of the second opening CH2 on the inside thereof to about 0.2 to 1.0 μm.

Figure 10H:
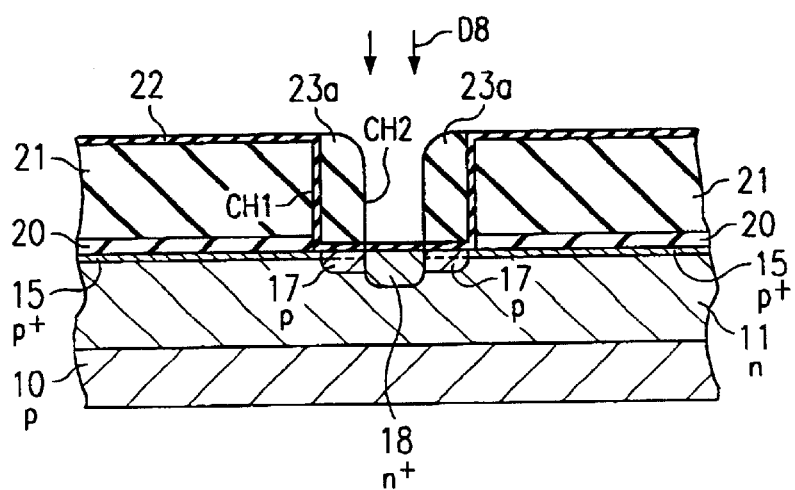

Next, as shown in FIG. 10(h), an n-type impurity D8 such as arsenic is introduced in a high concentration through the screen oxide film 22 by ion implantation using the sidewall insulating film 23a as a mask, thereby forming the n+ region 18 at the surface layer of the n-type buried channel 11 inside the second opening CH2 so as to connect to the n-type buried channel 11.

Figure 10I:
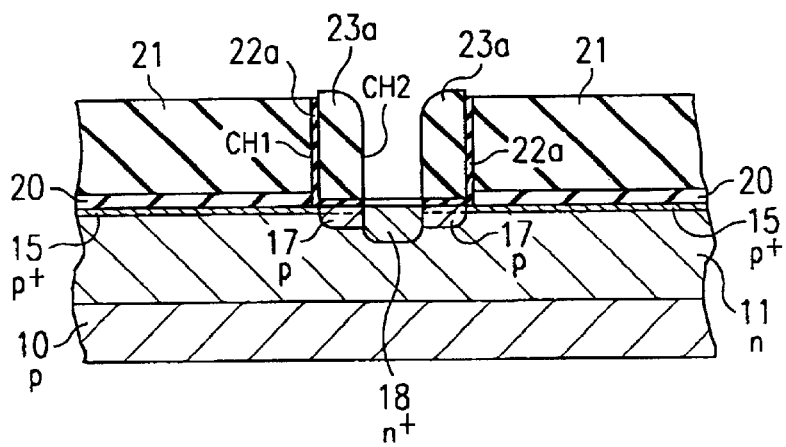

Next, as shown in FIG. 10(i), the n+ region 18 is exposed by removing the screen oxide film 22 inside the second opening CH2 by RIE or other etching having an etching selectivity ratio with respect to the sidewall insulating film 23a (such as silicon oxide), under conditions that allow for the removal of the screen oxide film 22. In this etching, the screen oxide film 22 on the interlayer insulating film 21 is also removed, leaving only the screen oxide film 22a where it covers the inner walls of the first opening CH1.

Next, aluminum containing copper is deposited over the entire surface by long-distance sputtering, collimator sputtering, IMP sputtering, or another such coherent sputtering method so as to connect to the n+ region 18, which fills in the opening CH. After this, the wiring layer 34 is formed through photolithography and dry etching, for example, which results in the structure shown in FIG. 7.

All subsequent steps, including sintering, are carried out at a temperature of 350° C. or lower, just as in the first embodiment. Also, the total duration of the treatment during which the temperature is 350° C. is set to no more than 2 hours.

The above method for manufacturing a CCD in this embodiment involves the use of copper-containing aluminum for the wiring material of the contacts of a lateral overflow drain LOD, and a solid-state imaging device can therefore be manufactured in which increases in dark current are suppressed while increases in contact resistance and the production of alloy spikes are prevented.

Also, the occurrence of contact coverage flaws can be prevented by forming a wiring layer composed of aluminum containing copper by coherent sputtering.

In addition, the production of alloy spikes can be effectively prevented by performing all of the treatment steps, including sintering, subsequent to the wiring layer formation for connecting to the contacts at a temperature no higher than 350° C.

Third Embodiment

Figure 11:
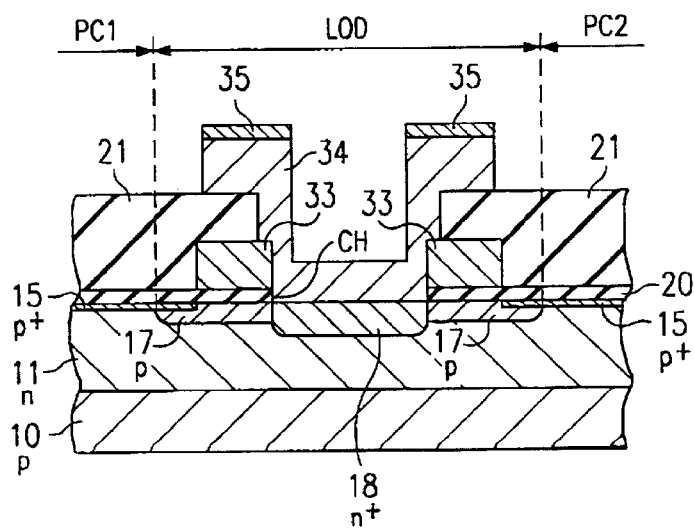
FIG. 11 is a cross section of the overflow drain portion of the CCD pertaining to the third embodiment of the present invention.

The lateral overflow drain LOD of the CCD pertaining to this embodiment has the cross sectional structure shown in FIG. 11, and is substantially the same as the first embodiment, but differs in that an anti-reflective film 35 such as a TiN film is formed over the wiring layer 34.

Since the TiN film does not touch the silicon substrate, it does not make dark current any worse, and increases in contact resistance and the production of alloy spikes can be prevented by using copper-containing aluminum for the wiring material of the contacts.

Also, since the anti-reflective film 35 is formed, it prevents reflection of the exposure light used for patterning the resist film in the photolithography step, and thereby prevents patterning flaws in the resist film being formed.

Fourth Embodiment

Figure 12A:
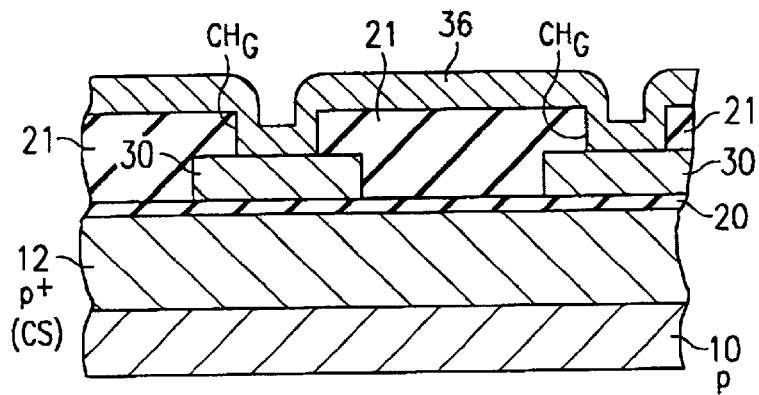
FIGS. 12(a) and 12(b) are cross sections of the overflow drain portion of the CCD pertaining to the fourth embodiment of the present invention.

The CCD pertaining to this embodiment has the cross sectional structure shown in FIG. 12(a), which corresponds to a cross section along the C–C' line in FIG. 1.

Specifically, this is a cross section in the direction of extension of the $p^+$ channel separation layer 12 of the p-type semiconductor substrate 10. The $p^+$ channel separation layer 12 is formed in the p-type semiconductor substrate 10, over which the gate insulating film 20 (silicon oxide, for example) is formed, over which the gate electrode 30 (polysilicon, for example) is formed, and over this is formed the interlayer insulating film 21 (silicon oxide) covering the gate electrode 30.

An opening $CH_G$ that leads to the gate electrode 30 is made in the interlayer insulating film 21, and a wiring layer 36 composed of copper-containing aluminum is formed so as to fill in this opening $CH_G$ and connect to the gate electrode 30. The amount of copper contained in the aluminum is the same as with the wiring layer connecting to the silicon substrate in the lateral overflow drain in the first embodiment. This wiring layer 36 is formed as wiring that does not cross the pixel region over the channel separation layer.

By forming the wiring layer 36 from aluminum containing copper, increases in contact resistance can be suppressed, and the use of titanium in the contacts is avoided, which prevents increases in the number of interface levels due to hydrogen adsorption to the titanium in the sintering step, suppresses increases in dark current, and keeps alloy spikes from being formed.

When the wiring layer 36 is formed in the CCD pertaining to this embodiment, it can be formed using the coherent sputtering method discussed in the first embodiment, and everything else can be formed by a standard method.

Figure 12B:
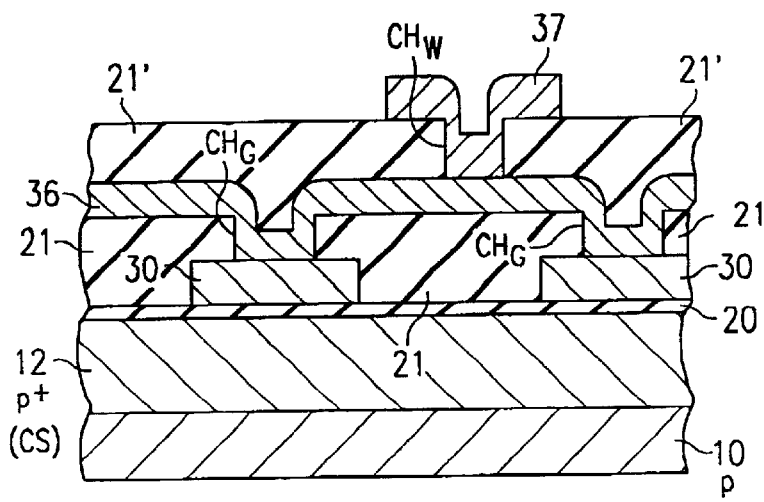
Figure 18:
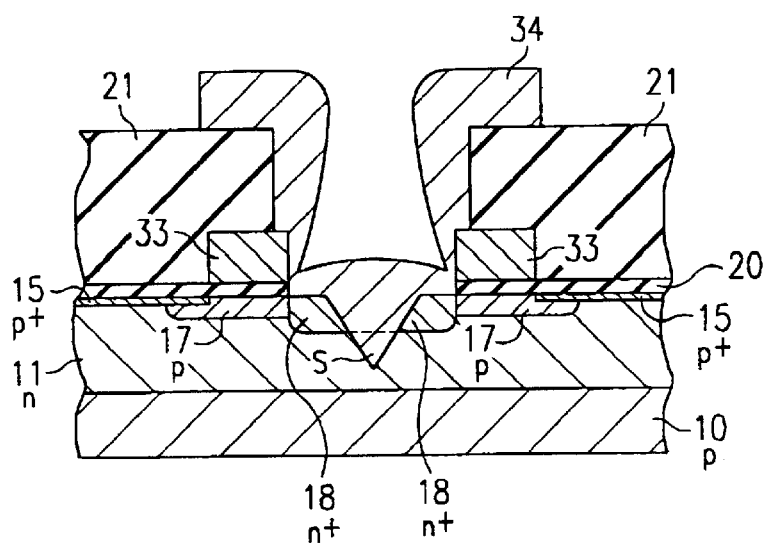
FIG. 18 is a cross section illustrating the problems with a conventional example.

As shown in FIG. 12(b), it is also possible to use a structure in which an upper insulating film 21' of silicon oxide or the like is formed over the wiring layer 36, an opening $CH_W$ leading to the wiring layer 36 is made, and an upper wiring layer 37 composed of aluminum containing copper is formed so as to fill in the opening $CH_W$ and connect to the wiring layer 36. Here again, the amount of copper contained in the aluminum is the same as with the wiring layer connecting to the silicon substrate in the lateral overflow drain in the first embodiment. The same effect as that with the CCD structure illustrated in FIG. 12(a) is obtained in this example as well.

Example 1

Figure 13A:
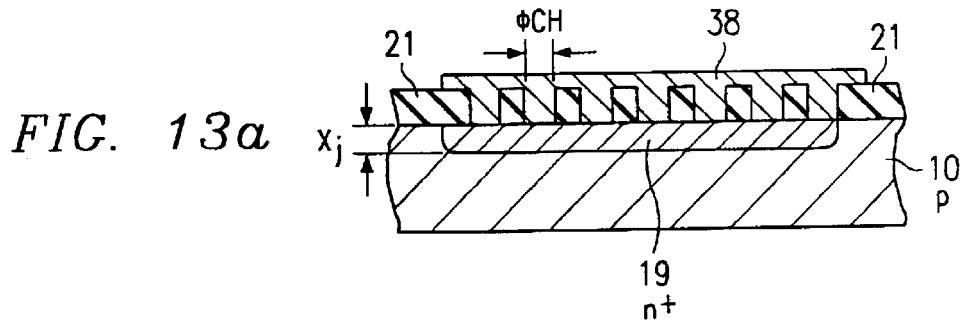
FIG. 13(a) is a cross section of a diode having the contact structure pertaining to Example 1.

As shown in the cross section of FIG. 13(a), an $n^+$ region 19 with a surface area of 180×320 $\mu m^{2[sic]}$ and a junction depth Xj of 0.4 $\mu$m was formed at the surface layer of a p-type semiconductor substrate 10, over the entire surface of which was formed an interlayer insulating film 21 of silicon oxide. Approximately 10,000 contact holes leading to the $n^+$ region 19 and having a diameter $\varnothing_{CH}$ of 0.6 $\mu$m were made in this product.

A wiring layer 38 was formed over the entire surface, covering the insides of the contact holes. A silicon oxide film (not shown) was formed over the wiring layer 38, and a heat treatment was performed for 2 hours at 350° C. to produce a sample.

Four different types of sample were produced, in which the following conditions (A) to (D) were employed in the formation of the wiring layer 38 above.

The above-mentioned wiring layer 38 was formed by (A) forming a 600 nm film from aluminum containing 0.5 wt % copper by long-distance sputtering, (B) forming an 800 nm film from aluminum containing 0.5 wt % copper by long-distance sputtering, (C) forming a 1000 nm film from aluminum containing 0.5 wt % copper by long-distance sputtering, and (D) forming a Ti/TiN layered film by sputtering to create a barrier metal, and then depositing tungsten (W) by CVD.

The contact portions of the above samples (A) to (D) were photographed by transmission electron microscopy before and after heat treatment at 350° C., which revealed that alloy spikes were not formed in any of the samples before or after the heat treatment.

The above samples (A) to (D) were measured for leak current when a reverse bias of 8 V was applied between the $n^+$ region 19 and the p-type semiconductor substrate 10.

Figure 13B:
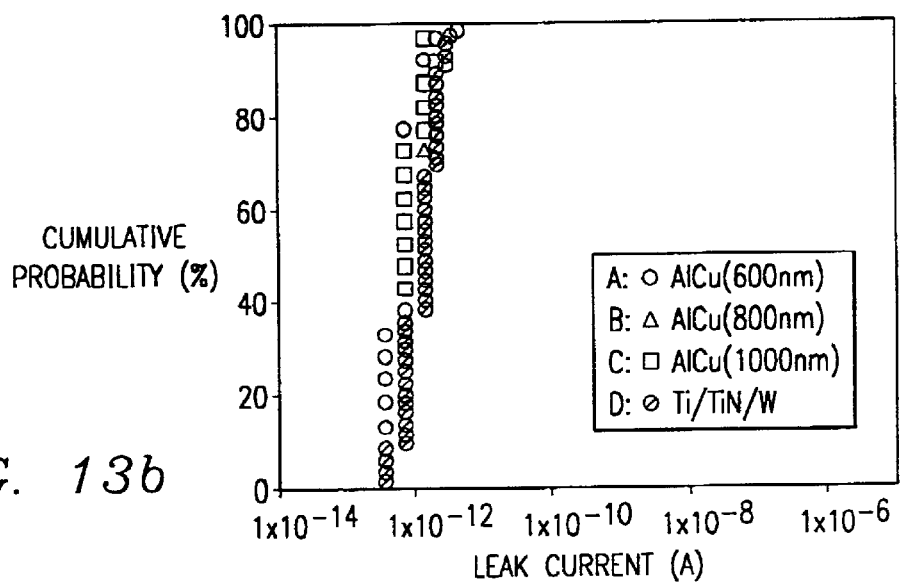
FIG. 13(b) is a graph in which leak current is plotted against cumulative probability.

The results thus obtained were plotted against cumulative probability, which is given in FIG. 13(b).

This graph reveals that the leak current value for samples (A) to (C), in which aluminum containing 0.5 wt % copper was used, was the same as that of sample (D), in which a film of Ti/TiN/W was formed, and that leak current was sufficiently low and no alloy spikes were formed in the samples in which aluminum containing 0.5 wt % copper was formed.

Example 2

Just as in Example 1, an $n^+$ region 19 was formed at the surface layer of a p-type semiconductor substrate 10, over the entire surface of which was formed an interlayer insulating film 21 of silicon oxide, and contact holes leading to the $n^+$ region 19 and having a diameter $\varnothing_{CH}$ of 1.4 $\mu$m were made in this product.

A wiring layer 38 was formed over the entire surface, covering the insides of the contact holes, under the following three sets of conditions. In each case an insulating film of silicon oxide was formed over this, after which a heat treatment was performed for 2 hours at 350° C. to produce three types of sample, (A) to (C).

The above-mentioned wiring layer 38 was formed by (A) forming [a film] from aluminum containing 0.5 wt % copper by sputtering, (B) forming [a film] from aluminum containing 1.0 wt % silicon by sputtering, and (C) forming [a film] from [pure] aluminum by sputtering.

Figure 14:
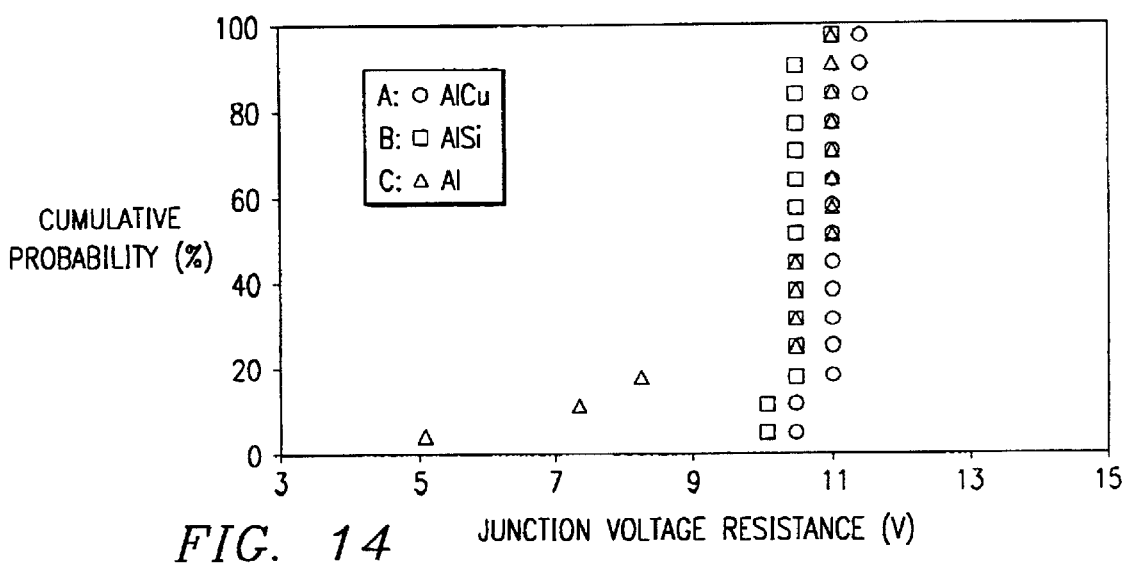
FIG. 14 is a graph pertaining to Example 2 in which the junction voltage resistance is plotted against cumulative probability.

The above samples (A) to (C) were each measured for $n^+$/p junction voltage resistance when the leak current reached 10 nA. The obtained results were plotted against cumulative probability, which is given in FIG. 14.

This graph reveals that when the wiring layer 38 comprised sample (C), in which [only] aluminum was used, there was a partial drop in junction voltage resistance, indicating that alloy spikes had formed, but the junction voltage resistance of sample (A), in which aluminum containing 0.5 wt % copper was used, was about the same as that of sample (B), in which aluminum containing silicon was used, which tells us that the sample in which aluminum containing 0.5 wt % copper was used had sufficiently high junction voltage resistance and no alloy spikes were formed.

Thus, adding copper to the aluminum lowers the solid-solution interface of silicon in the aluminum, and completely prevents the production of alloy spikes in 350° C. heat treatment.

Example 3

Just as in Example 1, an $n^+$ region 19 was formed at the surface layer of a p-type semiconductor substrate 10, over the entire surface of which was formed an interlayer insulating film 21, and contact holes leading to the n⁺ region 19 and having a diameter $\emptyset_{CH}$ of 0.6 µm were made in this product.

A wiring layer 38 was formed over the entire surface, covering the insides of the contact holes, under the following three sets of conditions. In each case an insulating film of silicon oxide was formed over this, after which a heat treatment was performed for 2 hours at 350° C. to produce four types of sample (A) to (D).

The above-mentioned wiring layer 38 was formed by (A) forming a 600 nm film from aluminum containing 0.5 wt % copper by long-distance sputtering, (B) forming an 800 nm film from aluminum containing 0.5 wt % copper by long-distance sputtering, (C) forming a 1000 nm film from aluminum containing 0.5 wt % copper by long-distance sputtering, and (D) forming a Ti/TiN layered film by sputtering to create a barrier metal, and then depositing tungsten (W) by CVD.

Figure 15A:
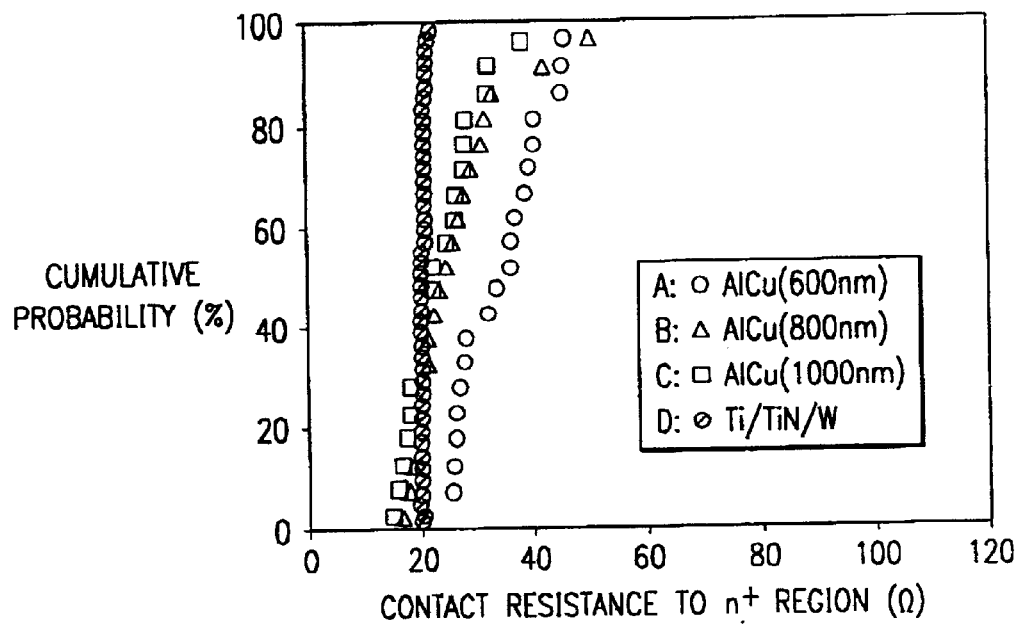
FIG. 15(a) is a graph pertaining to Example 3 in which contact resistance to the n⁺ region is plotted against cumulative probability.

The contact resistance to the n⁺ region was measured for each of the above samples (A) to (D). The obtained results were plotted against cumulative probability, which is given in FIG. 15(a).

This graph reveals that the contact resistance of samples (A) to (C), in which aluminum containing 0.5 wt % copper was used, was sufficiently low just as with sample (D), in which the Ti/TiN/W film was formed, although the distribution was spread out somewhat, and there was no precipitation of silicon at the contact bottom and no resulting higher resistance, as was the case with aluminum containing silicon.

Figure 15B:
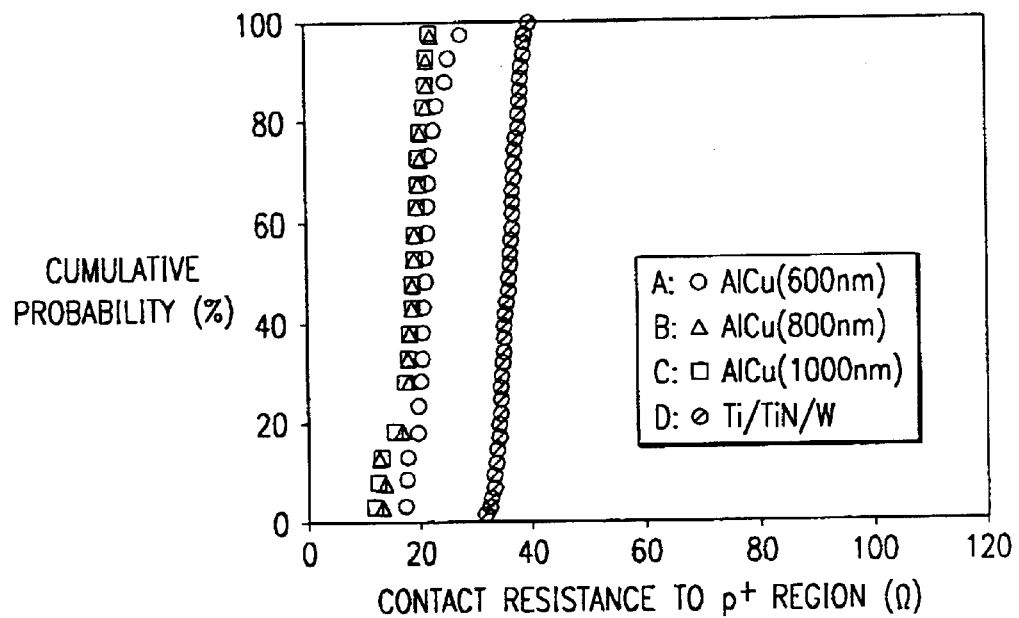
FIG. 15(b) is a graph in which contact resistance to the p⁺ region is plotted against cumulative probability.

Also, a p⁺ region was formed at the surface layer of a p-type semiconductor substrate, and the contact resistance to the p⁺ region was measured as above. The obtained results were plotted against cumulative probability, which is given in FIG. 15(b).

When the wiring layer 38 comprised samples (A) to (C), in which aluminum containing 0.5 wt % copper was used, the contact resistance was sufficiently low, just as with the contact resistance to the n⁺ region, and was even lower than sample (D), in which the Ti/TiN/W film was formed.

Example 4

A CCD having a lateral overflow drain with the same structure as in the first embodiment was produced. One sample was produced by making contact holes having a diameter of 0.6 µm, which was the inside diameter of annular gate electrodes of polysilicon, in the lateral overflow drain portion, and sputtering aluminum containing 0.5 wt % copper inside the openings by long-distance sputtering, and another sample was produced by forming a Ti/TiN layered film by sputtering to create a barrier metal, and then depositing tungsten (W) by CVD.

The CCD was completed through treatment steps in which the total duration of heat treatment at 350° C. was about 2 hours, including sintering and the formation of the upper insulating film of silicon oxide or the like.

The dark current was measured for the various samples, and as a result it was found that the dark current for the sample in which aluminum containing 0.5 wt % copper was used was only about 26% that of the sample in which a film of Ti/TiN/W was formed, confirming that there was no problem in terms of the dark current relative value.

Example 5

The temperature dependence of dark current was measured for the two different samples produced in Example 4 ((A) a sample in which aluminum containing 0.5 wt % copper was used and (B) a sample in which a Ti/TiN/W film was formed), and the activation energy was determined from an Arrhenius plot.

Figure 16A:
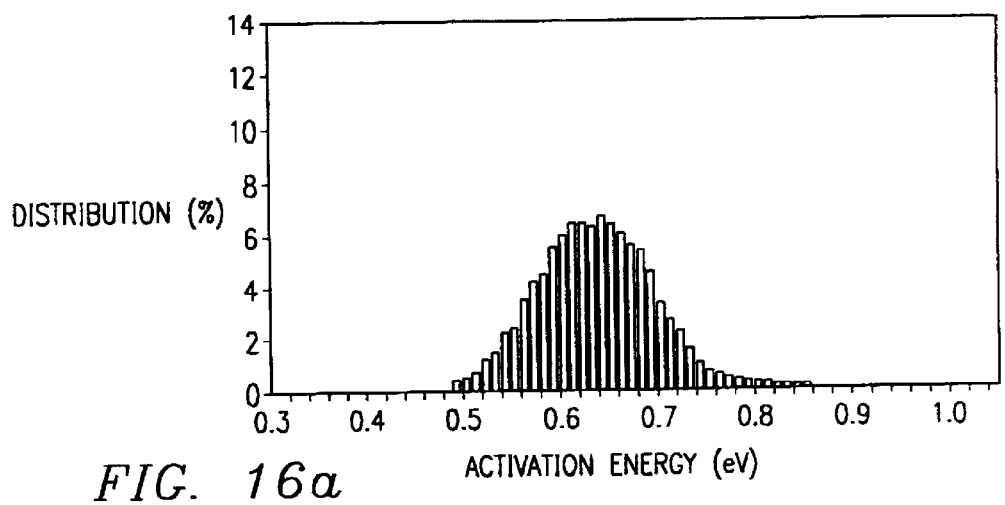
FIG. 16 consists of graphs pertaining to Example 5 of the activation energy distribution of dark current, with FIG. 16(a) a sample in which aluminum containing 0.5 wt % copper was used, and FIG. 16(b) a sample in which a Ti/TiN/W film was formed.
Figure 16B:
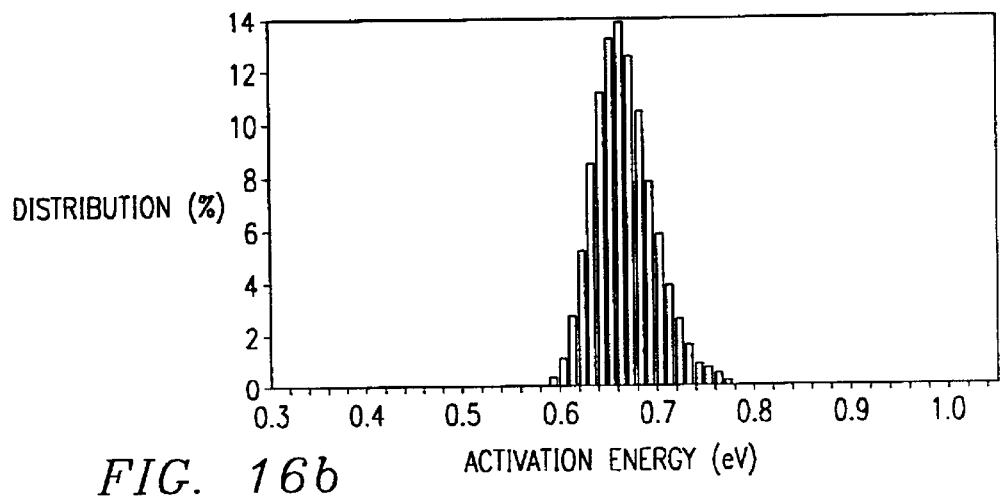
Figure 17:
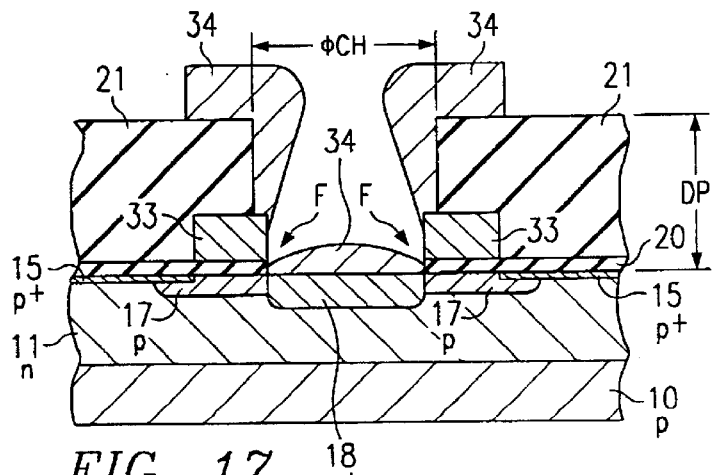
FIG. 17 is a cross section illustrating the problems with a conventional example.
Figure 19:
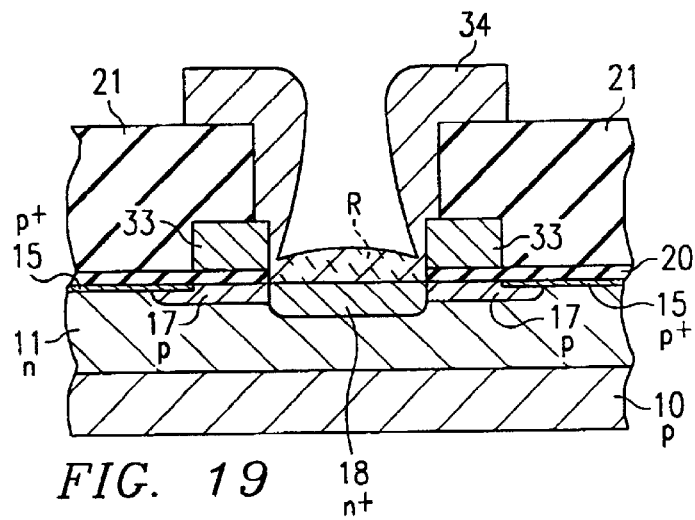
FIG. 19 is a cross section illustrating the problems with a conventional example.
Figure 20A:
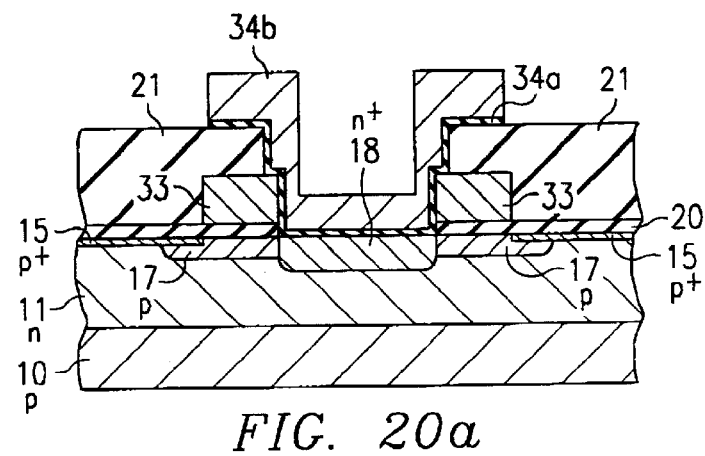
FIG. 20(a) is a cross section when a Ti/TiN/W film was formed in the overflow drain portion of a CCD.
Figure 20B:
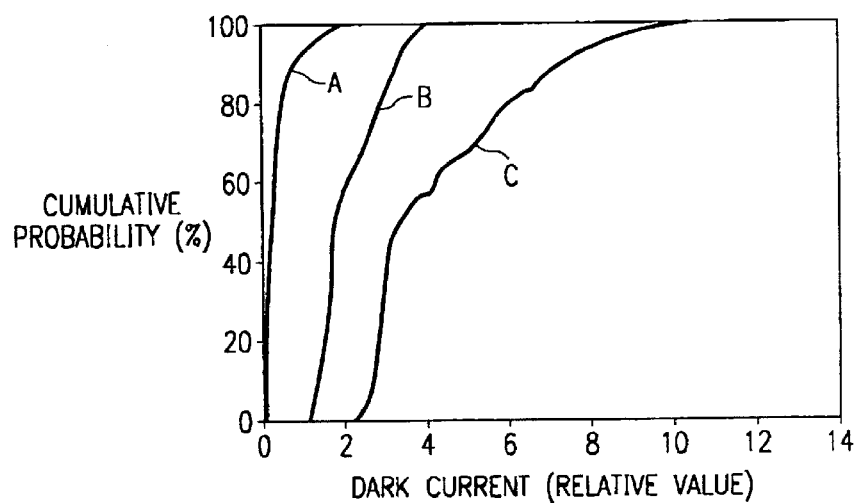
FIG. 20(b) is a graph of the difference in dark current between aluminum containing silicon and a Ti/TiN/W layered film.

FIGS. 16(a) and 16(b) are graphs of the distribution of activation energy for samples A and B, respectively.

The Ti/TiN/W layered film exhibited a sharp distribution near the center of the forbidden part of the energy band of silicon (0.65 eV), whereas with an aluminum alloy film containing copper and produced by coherent sputtering, the center of the distribution was in approximately the same location, but the curve was much broader. Specifically, with the use of the Ti/TiN/W layered film, the contribution from the deep level near 0.65 eV is dominant with respect to dark current, whereas with the aluminum alloy film containing copper, it is moderated.

The present invention is not limited to the above embodiments.

For example, in addition to a CCD, the solid-state imaging device of the present invention can also be applied to other solid-state imaging devices such as CMOS imaging elements.

Also, in addition to contacts in an overflow drain, the contacts comprising aluminum containing copper and used as the wiring layer can also be applied to a variety of other contacts, such as those for gate electrodes or channel separation layers.

The gate electrode and so forth had a single-layer structure above, but a structure of two or more layers may be used instead.

The CCD transfer component need not have a virtual gate structure, and in addition to a single phase drive system, a drive system of two or more phases may be used. Also, other materials besides those discussed in the above embodiments may be used for the material that makes up the gate electrode and other members. In addition to the above, various other modifications can be implemented within the scope of the essence of the present invention.

Effect of the Invention

With the solid-state imaging device of the present invention, increases in dark current can be suppressed while increases in contact resistance and the production of alloy spikes can be prevented by using aluminum containing copper for the wiring material of the contacts.

With the method of the present invention for manufacturing a solid-state imaging device, it is possible to manufacture a solid-state imaging device with which increases in dark current can be suppressed while increases in contact resistance and the production of alloy spikes can be prevented by using aluminum containing copper for the wiring material of the contacts. Furthermore, forming the wiring layer from aluminum containing copper by coherent sputtering allows the occurrence of contact coverage flaws to be prevented. In addition, the production of alloy spikes can be effectively prevented by performing all of the treatment steps, including sintering, subsequent to the wiring layer formation at a temperature no higher than 350° C., for example.

What is claimed is:

1. A solid-state imaging device, comprising:
   a semiconductor substrate of a first conduction type;
   a semiconductor layer of a second conduction type formed on the main surface of the semiconductor substrate;

a separation region of a first conduction type formed on the main surface of the semiconductor substrate so as to demarcate the semiconductor layer;

an annular first semiconductor region of a first conduction type formed adjacent to the separation region within the semiconductor layer demarcated by the separation region on the main surface of the semiconductor substrate;

a second semiconductor region of a second conduction type formed touching the first semiconductor region on the inside of the first semiconductor region on the main surface of the semiconductor substrate;

a first insulating film formed annularly over the first semiconductor region; and an electrode formed over the first insulating film so as to be contiguous with the second semiconductor region via an opening formed in the first insulating film, wherein the electrode is made up of aluminum containing copper, and a charge sweeping component is constituted by the first semiconductor region, the second semiconductor region, the first insulating film, and the electrode.

2. A solid-state imaging device as defined in claim 1, comprising:

a second insulating film formed over the semiconductor layer;

a transfer electrode formed over the second insulating film so as to be perpendicular to the separation region;

third and fourth semiconductor regions of a first conduction type, each with a different impurity concentration, formed so as to be parallel to the transfer electrode on the main surface of the semiconductor layer above which there is no transfer electrode; and a fifth semiconductor region formed so as to be parallel to the third and fourth semiconductor regions on part of the main surface of the semiconductor layer above which there is the transfer electrode, wherein the accumulated charge is transferred through the semiconductor layer according to the voltage applied to the transfer electrode.

3. A solid-state imaging device as defined in claim 2 wherein the copper is contained in an amount of 0.4 to 5 wt %.

4. A solid-state imaging device as defined in claim 2 wherein the copper is contained in an amount of 0.5 to 0.8 wt %.

5. A solid-state imaging device as defined in claim 1 wherein the copper is contained in an amount of 0.4 to 5 wt %.

6. A solid-state imaging device as defined in claim 1 wherein the copper is contained in an amount of 0.5 to 0.8 wt %.

7. A solid-state imaging device, comprising:

a conducting layer formed on the main surface of a semiconductor substrate;

an insulating layer formed over the main surface of the semiconductor substrate;

an opening formed in the insulating layer so as to reach the conducting layer; and a wiring layer formed over the insulating layer so as to connect to the conducting layer via the opening, wherein the wiring layer is made up of aluminum containing copper.

8. A solid-state imaging device as defined in claim 7 wherein the copper is contained in an amount of 0.4 to 5 wt %.

9. A solid-state imaging device as defined in claim 7 wherein the copper is contained in an amount of 0.5 to 0.8 wt %.

* * * * *